United States Patent
Hwang et al.

(10) Patent No.: US 7,411,208 B2
(45) Date of Patent: Aug. 12, 2008

(54) PHASE-CHANGE MEMORY DEVICE HAVING A BARRIER LAYER AND MANUFACTURING METHOD

(75) Inventors: Young-Nam Hwang, Gyeonggi-do (KR); Gwan-Hyeob Koh, Seoul (KR); Su-Jin Ahn, Seoul (KR); Sung-Lae Cho, Gyeonggi-do (KR); Se-Ho Lee, Seoul (KR); Kyung-Chang Ryoo, Gyeonggi-do (KR); Chang-Wook Jeong, Seoul (KR); Su-Youn Lee, Gyeonggi-do (KR); Bong-Jin Kuh, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 105 days.

(21) Appl. No.: 11/027,255

(22) Filed: Dec. 30, 2004

(65) Prior Publication Data
US 2005/0263823 A1 Dec. 1, 2005

(30) Foreign Application Priority Data
May 27, 2004 (KR) ............... 10-2004-0037965

(51) Int. Cl.
*H01L 45/00* (2006.01)
(52) U.S. Cl. ............. 257/4; 257/2; 257/3; 257/E45.002
(58) Field of Classification Search ............. 257/2–4, 257/E45.002
See application file for complete search history.

(56) References Cited

U.S. PATENT DOCUMENTS

| | | | |
|---|---|---|---|
| 4,115,872 A | * | 9/1978 | Bluhm ............... 365/163 |
| 4,366,614 A | | 1/1983 | Kumurdjian |
| 4,499,557 A | | 2/1985 | Holmberg et al. |
| 4,599,705 A | | 7/1986 | Holmberg et al. |
| 5,177,567 A | * | 1/1993 | Klersy et al. ............. 257/4 |
| 5,952,671 A | | 9/1999 | Reinberg et al. |
| 6,031,287 A | * | 2/2000 | Harshfield ............ 257/734 |
| 6,147,395 A | | 11/2000 | Gilgen |
| 6,189,582 B1 | | 2/2001 | Reinberg et al. |

(Continued)

FOREIGN PATENT DOCUMENTS

CN 1506973 A 6/2004

(Continued)

OTHER PUBLICATIONS

English language abstract of Japanese Publication No. 2003-298013.

(Continued)

*Primary Examiner*—Jerome Jackson
*Assistant Examiner*—Jose R Diaz
(74) *Attorney, Agent, or Firm*—Marger Johnson & McCollom, P.C.

(57) ABSTRACT

A phase-change memory device has an oxidation barrier layer to protect against memory cell contamination or oxidation and a method of manufacturing the same. In one embodiment, a semiconductor memory device comprises a molding layer overlying a semiconductor substrate. The molding layer has a protrusion portion vertically extending from a top surface thereof. The device further includes a phase-changeable material pattern adjacent the protrusion portion and a lower electrode electrically connected to the phase-changeable material pattern.

44 Claims, 13 Drawing Sheets

U.S. PATENT DOCUMENTS

| | | | |
|---|---|---|---|
| 6,337,266 B1 | 1/2002 | Zahorik | |
| 6,531,391 B2 | 3/2003 | Zahorik | |
| 6,635,951 B1 | 10/2003 | Zahorik | |
| 6,642,102 B2 | 11/2003 | Xu | |
| 6,744,088 B1 * | 6/2004 | Dennison | 257/296 |
| 6,806,528 B2 | 10/2004 | Lee et al. | |
| 6,858,482 B2 * | 2/2005 | Gilton | 438/199 |
| 7,037,749 B2 * | 5/2006 | Horii et al. | 438/95 |
| 7,042,001 B2 * | 5/2006 | Kim et al. | 257/3 |
| 7,105,396 B2 | 9/2006 | Hwang et al. | |
| 2003/0209746 A1 | 11/2003 | Horii | |
| 2003/0219924 A1 | 11/2003 | Bez et al. | |
| 2003/0231530 A1 | 12/2003 | Bez et al. | |
| 2004/0087074 A1 | 5/2004 | Hwang et al. | |
| 2005/0263829 A1 * | 12/2005 | Song et al. | 257/379 |

FOREIGN PATENT DOCUMENTS

| | | |
|---|---|---|
| DE | 2822264 | 12/1978 |
| DE | 3046721 | 10/1981 |
| DE | 10351017 | 5/2004 |
| JP | 2003-298013 | 10/2003 |
| KR | 2003-0081900 | 10/2003 |

OTHER PUBLICATIONS

English language abstract of Korean Publication No. 2003-0081900.
Gu, Si-Peng, Hou, Li-Song, Zeng, Xian-Cheng and Zhao, Qi-Tao, Optical Properties of Ge—Sb—Te—O Phase-Change Films, Optical instruments, Dec. 2001, pp. 23-26, vol. 23, No. 5-6, China Academic Journal, China.

* cited by examiner

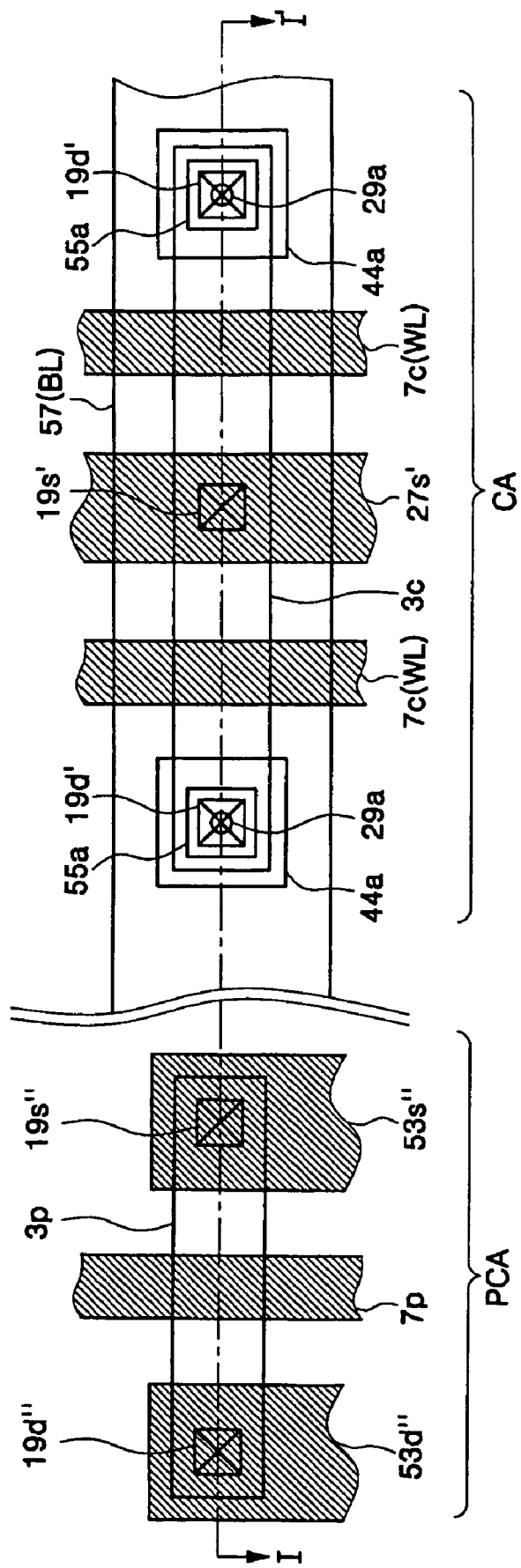

PHASE-CHANGE MEMORY DEVICE HAVING A BARRIER LAYER AND MANUFACTURING METHOD

This application claims priority from Korean Patent Application No. 2004-37965, filed on May 27, 2004, the disclosure of which is incorporated herein in its entirety by reference.

BACKGROUND OF THE INVENTION

1. Field of the Invention

The invention relates to a semiconductor memory device and methods of fabricating the same, and more particularly, to a phase-change memory device and methods of fabricating the same.

2. Description of Related Art

The use of phase-changeable materials for electronic memory applications is known in the art and is disclosed, for example, in U.S. Pat. No. 6,147,395 and U.S. Pat. No. 6,337,266. The two states of a memory, in the case of phase-changeable memory, depend on the resistance to current flow in a memory cell. The phase-changeable material typically has an amorphous phase and a crystalline phase, with inherent high and low electrical resistance, respectively. The amorphous phase exists at relatively high temperatures, and the crystalline phase exists at relatively low temperatures. Phase-changeable memory operates on the basic idea that memory cell states, i.e., "on" or "off", are dependent on temperature. Thus, means for setting the temperature high or low is incorporated in each memory cell.

A general structure for this type of memory includes a phase-changeable material sandwiched between a lower electrode and an upper electrode. The lower electrode typically plays two roles, one being the conduction electrode to the memory cell, and the other being an ohmic heater to control the phase of the phase-changeable material. As just described, the structure comprises interfaces between the top electrode and the phase-changeable material, and between the bottom electrode and the phase-changeable material. During a fabrication of the memory device, and during its operational life in use, these interfaces may become contaminated or oxidized. Such oxidation causes a large variation in the distribution of contact resistances at these interfaces. Since the operation of phase-changeable memory depends on distinguishing between the memory cell being "on" or "off" based on the cell's resistance to current flow, contamination or oxidation jeopardizes the accuracy of memory programming. A need still remains for a novel phase-change memory structure that can prevent such contamination or oxidation and the manufacturing method thereof.

SUMMARY OF THE INVENTION

A phase-change memory device has an oxidation barrier layer to protect against memory cell contamination or oxidation and a method of manufacturing the same. In one embodiment, a semiconductor memory device comprises a molding layer overlying a semiconductor substrate. The molding layer has a protrusion portion vertically extending from a top surface thereof. The device further includes a phase-changeable material pattern adjacent the protrusion portion and a lower electrode electrically connected to the phase-changeable material pattern. According to one aspect of the present invention, an oxidation barrier layer may cover an area where a sidewall of the phase-changeable material pattern and a sidewall of the protrusion portion adjoin. More stable operation and a longer operational lifetime of the phase-change memory device are some of the benefits of the present invention.

BRIEF DESCRIPTION OF THE DRAWINGS

FIG. 1b is a plan view of a portion of a phase-change memory cell array area and peripheral circuit area according to an embodiment of the present invention.

DETAILED DESCRIPTION OF THE PREFERRED EMBODIMENTS

Figure 1A:
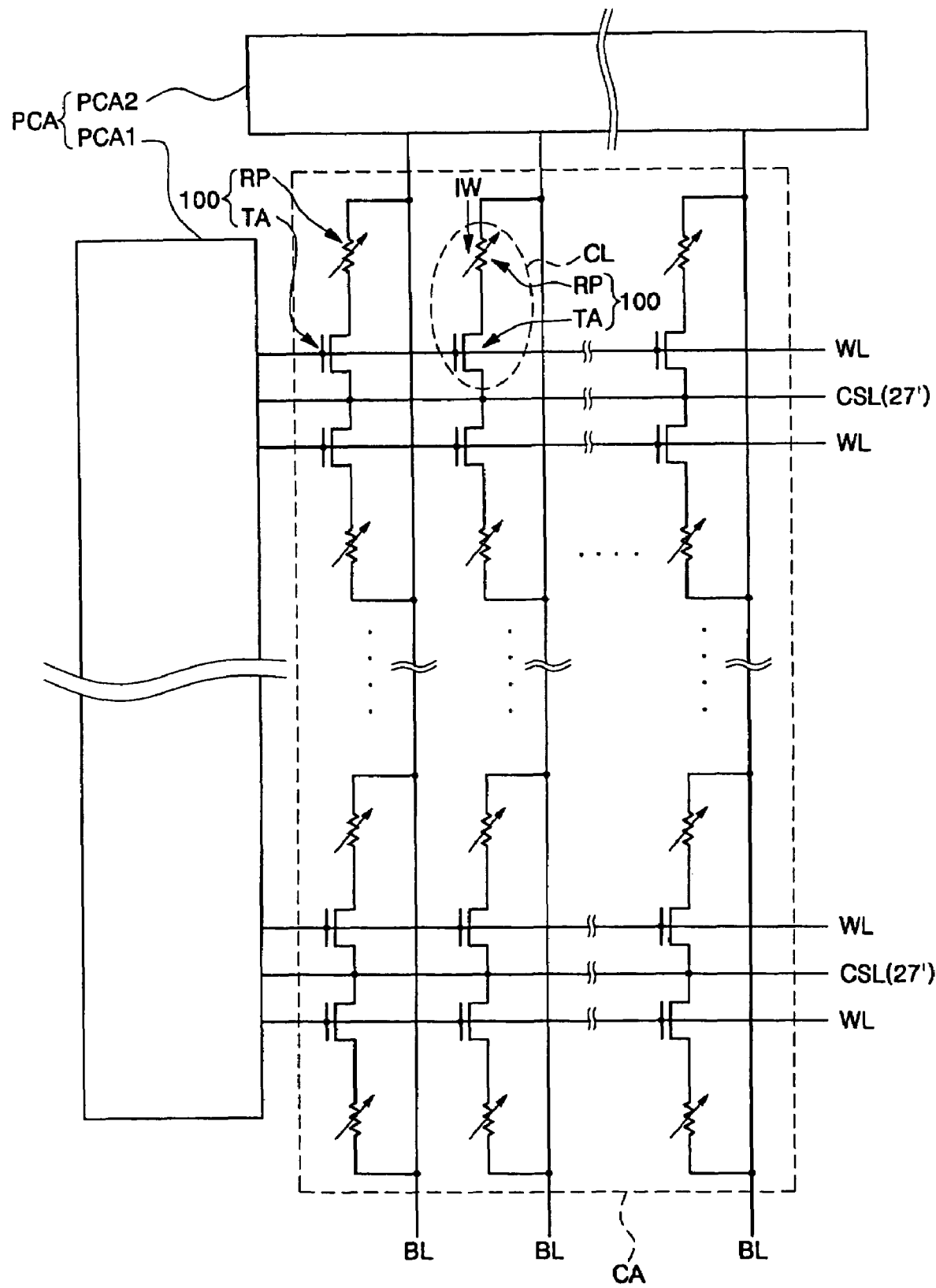
FIG. 1a is a schematic view of an embodiment that features a phase-change memory cell array (CA) and a peripheral circuit area (PCA) of the present invention.

FIG. 1a is a schematic view of an embodiment that features a phase-change memory cell array CA and a peripheral circuit area PCA of the present invention. The cell array area CA comprises an array of memory cells CL each of which in turn comprises an access transistor TA and a phase-change resistor RP. Each memory cell CL is connected to a bit line BL, a word line WL, and a common source line CSL in a configuration that is known in the art. Other conventional structures will be included in the present invention. For example, the peripheral circuit area PCA includes first and second integrated circuits PCA1, PCA2 to drive the memory cells CL. The state of a memory cell CL is determined by a current sensing of a writing current IW. The current sensing and other functions of memory control are known to one skilled in the art.

FIG. 1b is a plan view of a portion of the phase-change memory cell array area CA and a portion of the peripheral circuit area PCA according to an embodiment of the invention. FIG. 1b shows a cell active region 3c, a common source line 27s' (which will be referred to as "common source pad 27s'" in the context of subsequent figures), cell gate electrodes 7c, a peripheral gate electrode 7p, a bit line 57, first and second source contact holes 19s' and 19s''', a bit line contact hole 55a, first and second drain contact holes 19d' and 19d''', a phase-change resistor 44a, and a phase-change resistor contact hole 29a. The details of these elements will be explained later.

FIGS. 2-9 are each cross-sectional views taken along line I-I' of FIG. 1b showing a processing step of manufacturing an embodiment of the present invention.

Figure 2:
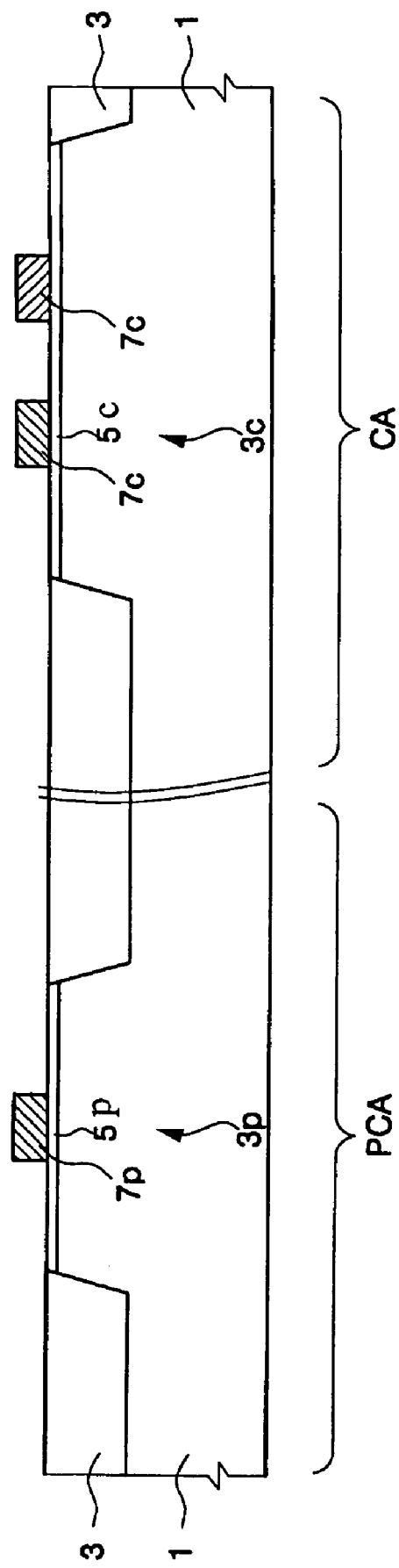
FIGS. 2-9 are each cross-sectional views taken along line I-I' of FIG. 1b showing processing steps of manufacturing an embodiment of the invention.

Referring to FIG. 2, the cell gate electrode 7c and the peripheral gate electrode 7p are respectively formed on a cell gate dielectric layer 5c in the cell active region 3c and on a peripheral gate dielectric layer 5p in a peripheral circuit active region 3p, defined by a field isolation region 3 that is formed on a semiconductor substrate 1. The widths of the cell gate electrode 7c and the peripheral gate electrode 7p may be different. Preferably, the width of the peripheral gate electrode 7p is at least about 1.5 times greater than that of the cell gate electrode 7c. Furthermore, the peripheral gate dielectric layer 5p may be formed to be thicker than the cell gate dielectric layer 5c.

Figure 3:
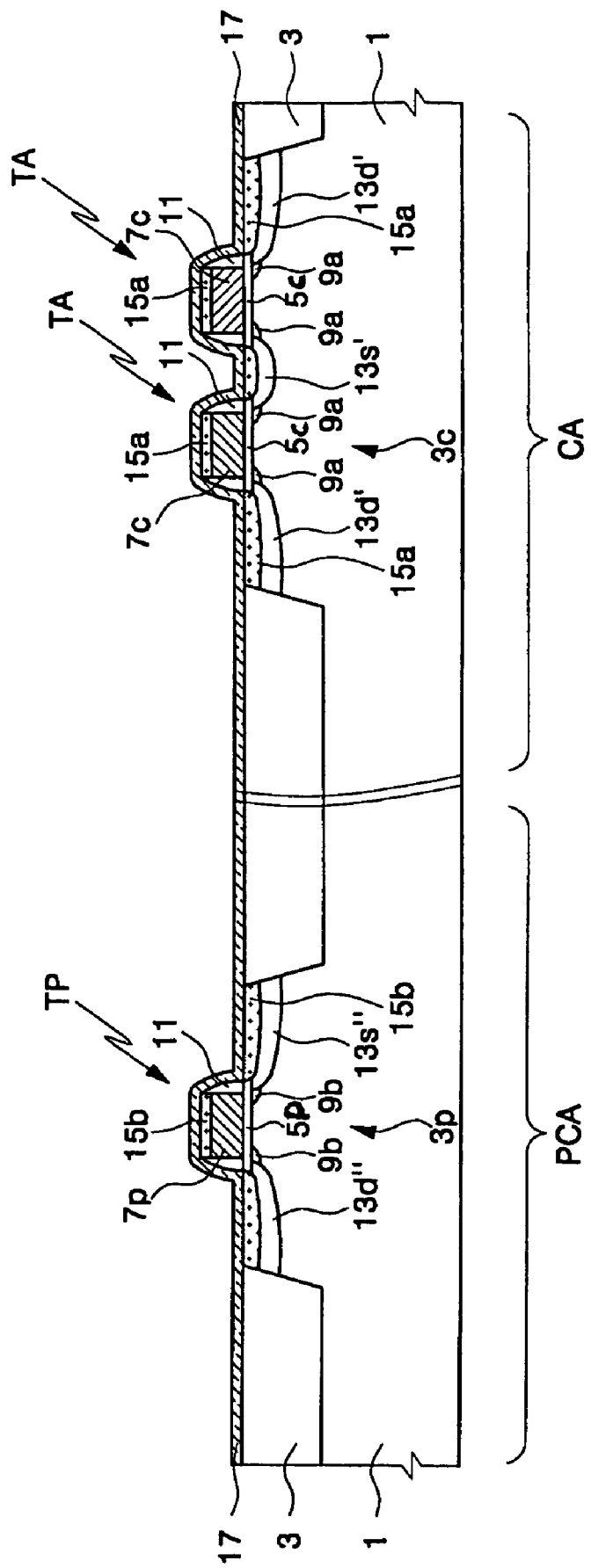

Referring to FIG. 3, a peripheral circuit MOS transistor TP and a cell access MOS transistor TA are formed. In detail, using the cell gate electrode 7c as an ion implantation mask, an n-type first low concentration impurity region 9a is formed in the cell active region 3c. Further, a p-type second low concentration impurity region 9b is formed in the peripheral circuit active region 3p, using the peripheral gate electrode 7p as an ion implantation mask.

Also, a gate spacer 11 of a conventional spacer material such as oxide or nitride is preferably formed along opposite sides of the cell gate electrode 7c and also along opposite sides of the peripheral gate electrode 7p, using conventional techniques.

Next, using the gate spacer 11, an n-type first source region 13s' and an n-type first drain region 13d' are formed in the cell active region 3c. In addition, a p-type second source region 13s''', a p-type second drain region 13d''' are subsequently formed in the peripheral circuit active region 3p, using the methods known in the art. As a result, a pair of access (switching) MOS transistor TA are formed in the cell area CA and a peripheral MOS transistor TP is formed in the peripheral circuit area PCA.

A silicide layer 15b may be formed on at least one of the second source and drain regions 13s''' and 13d''' and the peripheral gate electrode 7p. A silicide layer 15a may be formed on at least one of the first source and drain regions 13s' and 13d' and the cell gate electrode 7c. Then, a lower etch stopper 17 is formed over the resulting structure.

Figure 4:
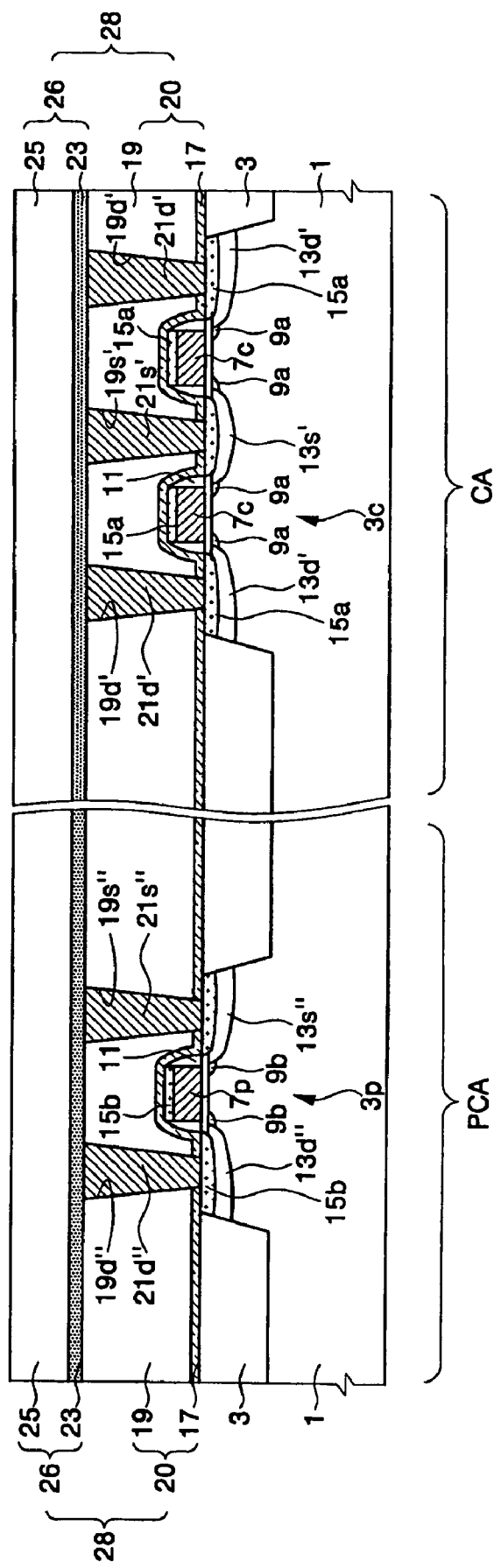

Referring to FIG. 4, a lower insulating layer 19 is formed over the lower etch stopper 17, both of which are combined to form a lower inter-level insulating layer 20.

Subsequently, the first source contact hole 19s', the first drain contact hole 19d' are formed in the lower inter-level insulating layer 20 in the cell area CA. Then, a first source contact plug 21s' and a first drain contact plug 21d' are respectively formed in the first source contact hole 19s', the first drain contact hole 19d', using the methods known in the art. Also, the second source contact hole 19s''', the second drain contact hole 19d''', a second source contact plug 21s''', and a second drain contact plug 21d''' are formed in the peripheral circuit area PCA in the lower inter-level insulating layer 20, using the conventional techniques.

Then, an upper inter-level insulating layer 26 is formed, comprising an upper etch stopper 23 and an upper insulating layer 25. An element 28 denotes an interlayer insulating layer comprised of the layers 17, 19, 23, and 25 described above.

Figure 5:
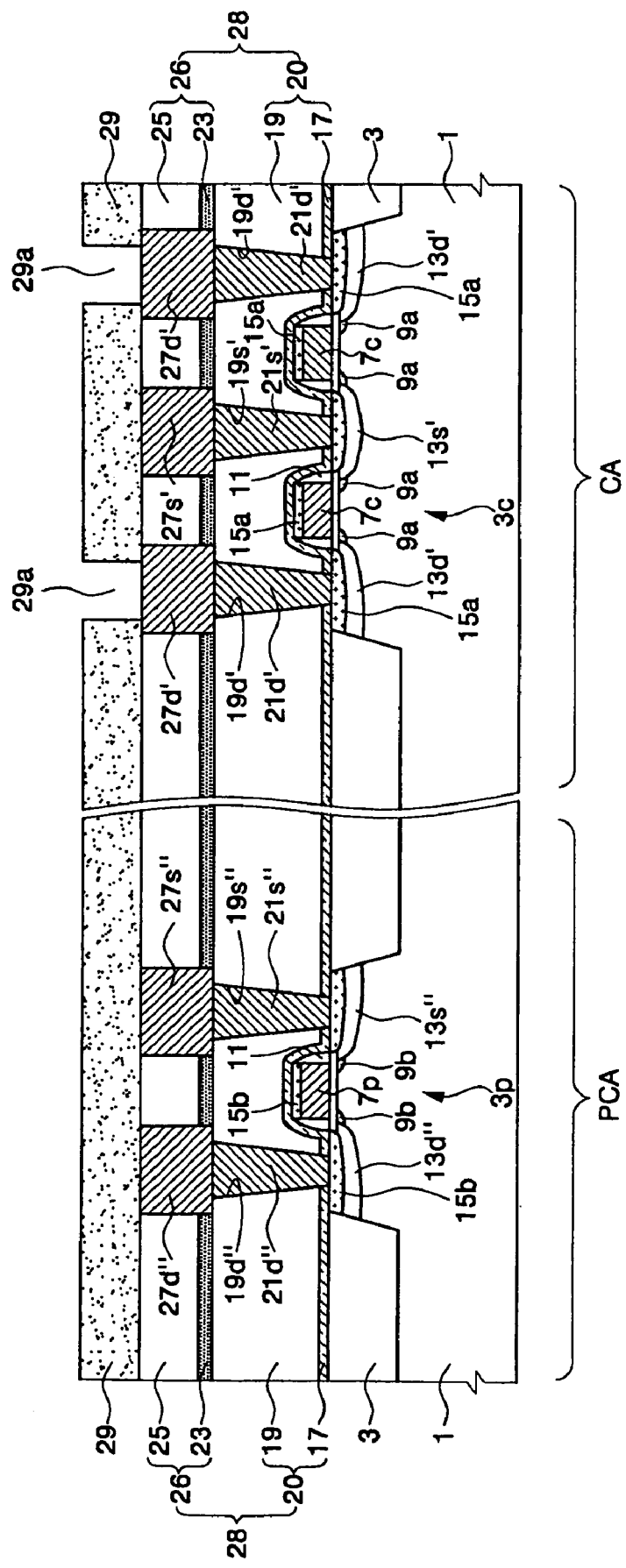

Referring to FIG. 5, a common source pad 27s', which represents a cross-section of the common source line 27s' in FIG. 1b, a conductive pad, i.e., a first drain pad 27d', a peripheral circuit region source pad 27s''', and a peripheral circuit region drain pad 27d''' are formed within the upper inter-level insulating layer 26 shown in FIG. 4. These elements are formed according to processes known to one skilled in the art. Consequently, the common source pad 27s' and the first drain pad 27d' are respectively electrically connected to the first source region 13s' and the first drain region 13d'.

Afterwards, a molding layer 29 is formed on the resulting structure. A phase-change resistor contact hole 29a is then formed in the molding layer 29, using photolithography and etching processes. The molding layer 29 is preferably formed of a material having a high thermal conductivity. For example, the molding layer 29 has a thermal conductivity higher than that of silicon oxide. This gives a high rapid quenching efficiency of a phase transition of a phase-changeable material pattern, in addition to an oxygen barrier characteristic to prevent the phase-changeable material pattern from being oxidized. Such materials include silicon nitride and silicon oxynitride, for example.

Figure 6:
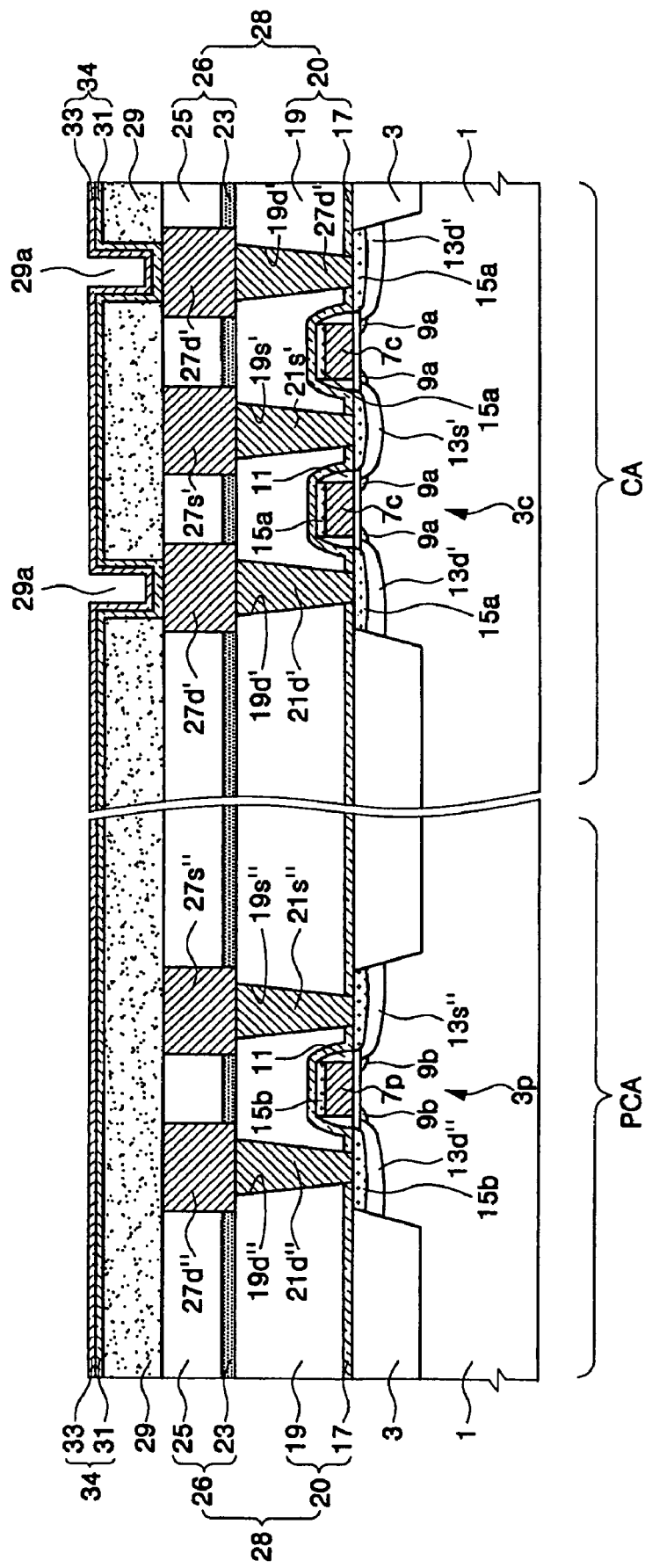

Turning to FIG. 6, a conformal contact spacer layer 34 may be formed of either one or two layers. Preferably, the conformal contact spacer layer 34 is formed under vacuum without using an oxygen gas. If the oxygen gas is used to form the conformal contact spacer layer 34, to prevent the oxidation of the drain pad 27d, it is preferable to use a lower formation temperature. The conformal contact spacer layer 34 may be a silicon nitride layer formed using plasma-enhanced (PE) CVD, or low-pressure (LP) CVD. The conformal contact spacer layer 34 may be formed of two layers, comprising a lower contact spacer layer 31 of a silicon oxynitride layer formed by using PE-CVD at less than about 500° C., and an upper contact spacer layer 33 of silicon nitride formed by using LP-CVD at greater than about 500° C.

Figure 7:
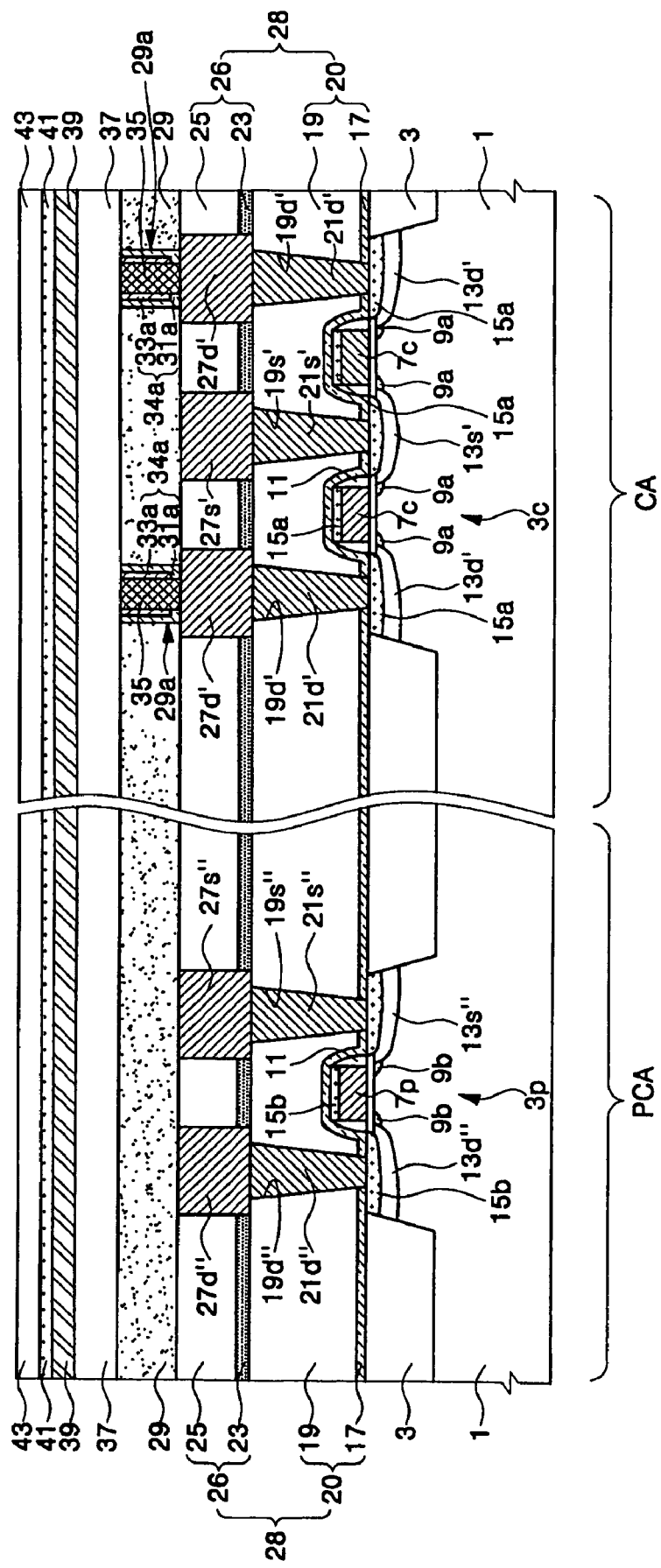

Referring to FIG. 7, the conformal contact spacer layer 34 is anisotropically etched to expose the first drain pad 27d'. As a result, a contact spacer 34a including an inner contact spacer 31a and an outer contact spacer 33a, is formed. The outer contact spacer 33a surrounds an outer wall of the inner contact spacer 31a.

Then, a lower electrode 35 is formed in the phase-change resistor contact hole 29a within the contact spacer 34a. The lower electrode 35 is electrically connected to the first drain pad 27', which is in turn electrically connected to the first drain region 13d' of the switching transistor TA through first contact plug 21d'. In detail, the lower electrode 35 in the phase-change resistor contact hole 29a may be formed by depositing a conductive film such as a TiN film, or a TiAlN film overlying the molding layer 29 and within the contact hole 29a and by planarizing the conductive film until the molding layer 29 is exposed. As a result, the contact spacer 34a surrounds the sidewall of the lower electrode 35.

Subsequently, a phase-changeable material layer 37, an upper electrode layer 39, a glue layer 41, and a hard mask layer 43 are sequentially formed on the resulting structure including the molding layer 29. The hard mask layer 43 may be formed of $SiO_2$. The glue layer 41 may be a wetting layer such as SiN. One skilled in the art will, however, understand that the above-described structure is only a preferred embodiment and other suitable structures can also be used within the spirit and scope of the present invention. For example, the hard mask layer 43 can be formed using a dielectric material other than $SiO_2$.

The phase-changeable material layer 37 may be formed of a chalcogenide material, including, but not limited to, a GeSbTe alloy, or a Si or N doped GeSbTe alloy, with a thickness of, for example, about 1000 Å.

Figure 8:
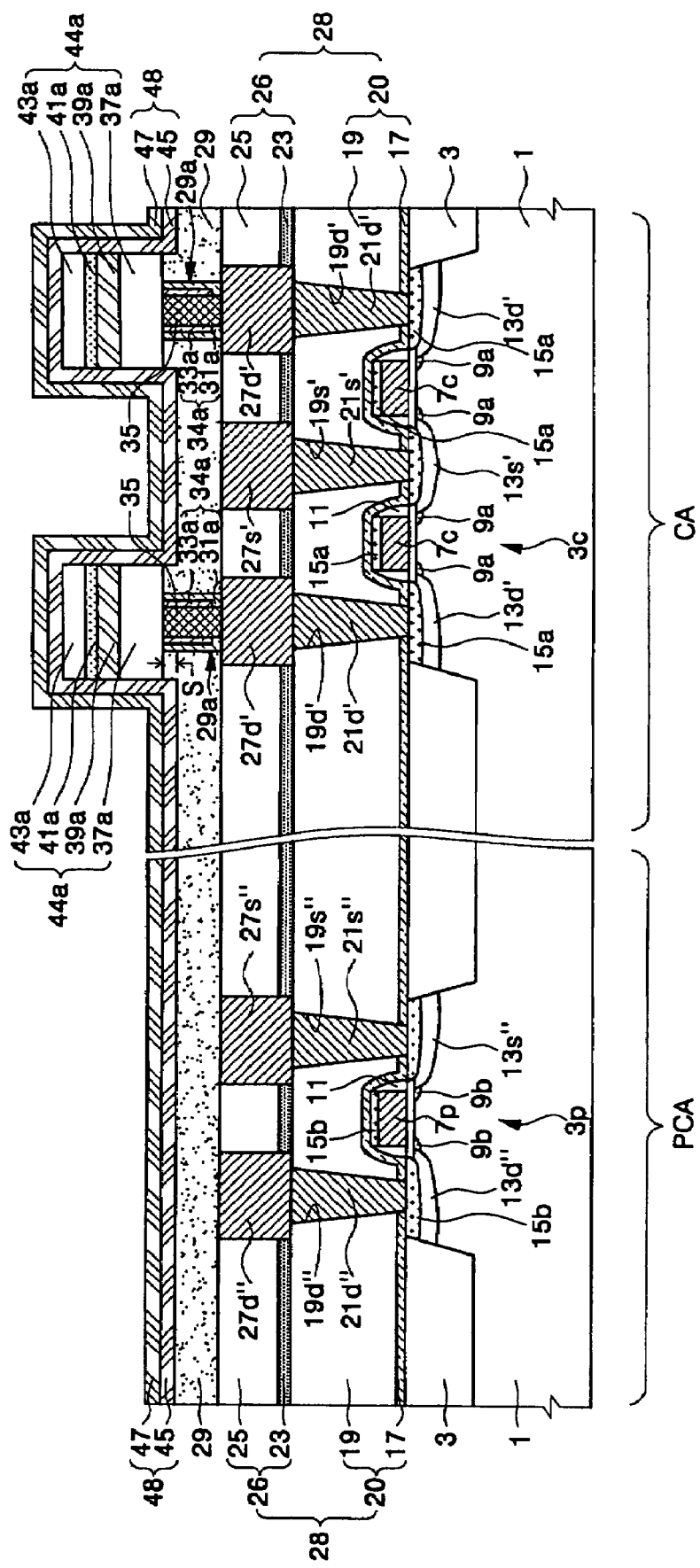

In FIG. 8, a phase-change resistor 44a may be formed by patterning the hard mask layer 43, the glue layer 41, the upper electrode layer 39, and the phase-changeable material layer 37 to form a hard mask layer pattern 43a, an upper electrode 39a, and a phase-changeable material pattern 37a, and then etching an upper portion of the molding layer 29 to thereby be completely separated from an adjacent phase-changeable material pattern 37a. This process also creates a protrusion portion 77 of the molding layer 29 that is self-aligned with the phase-change resistor 44a. The protrusion portion 77 of the molding layer 29 results in a surface step difference indicated by symbol "S," shown in FIG. 8. The phase-changeable material pattern 37a is electrically connected to the lower electrode 35.

Next, an oxidation barrier layer 48 may cover the resulting structure including the phase-change resistor 44a. The oxidation barrier layer 48 may comprise a single layer of nitride, for example, silicon nitride or silicon oxynitride, deposited using a PE-CVD process, or an atomic layer deposition (ALD) process at less than or equal to about 350° C. Alternatively, the oxidation barrier layer 48 may be formed of double layers, comprising a lower oxidation barrier layer 45 of nitride, such as silicon nitride or silicon oxynitride, deposited using a PE-CVD process or an ALD process at less than or equal to about 350° C.; and an upper oxidation barrier layer 47 of nitride, such as silicon nitride or silicon oxynitride, deposited using PE-CVD process or an LP CVD process at higher than or equal to about 350° C.

The oxidation barrier layer 48 prevents the phase-changeable material pattern 37a from being oxidized or contaminated by oxygen or impurities that may penetrate into an interface between the lower electrode 35 and the phase-changeable material pattern 37a, or another interface between the upper electrode 39a and the phase-changeable material pattern 37a during a process such as an oxide deposition (ILD deposition) to cover the phase-change resistor 44a.

Because the oxidation barrier layer 48 covers the sidewalls of the protrusion portion 77 of the molding layer 29, as well as the sidewalls and/or the upper surface of the phase-change resistor 44a, penetration of oxygen into the phase-change resistor 44a can be efficiently blocked.

Additionally, a plasma nitridation process may be performed on the surface of the phase-change resistor 44a, using an $N_2$ or $NH_3$ gas at less than or equal to about 350° C. before forming the oxidation barrier layer 48.

Figure 9:
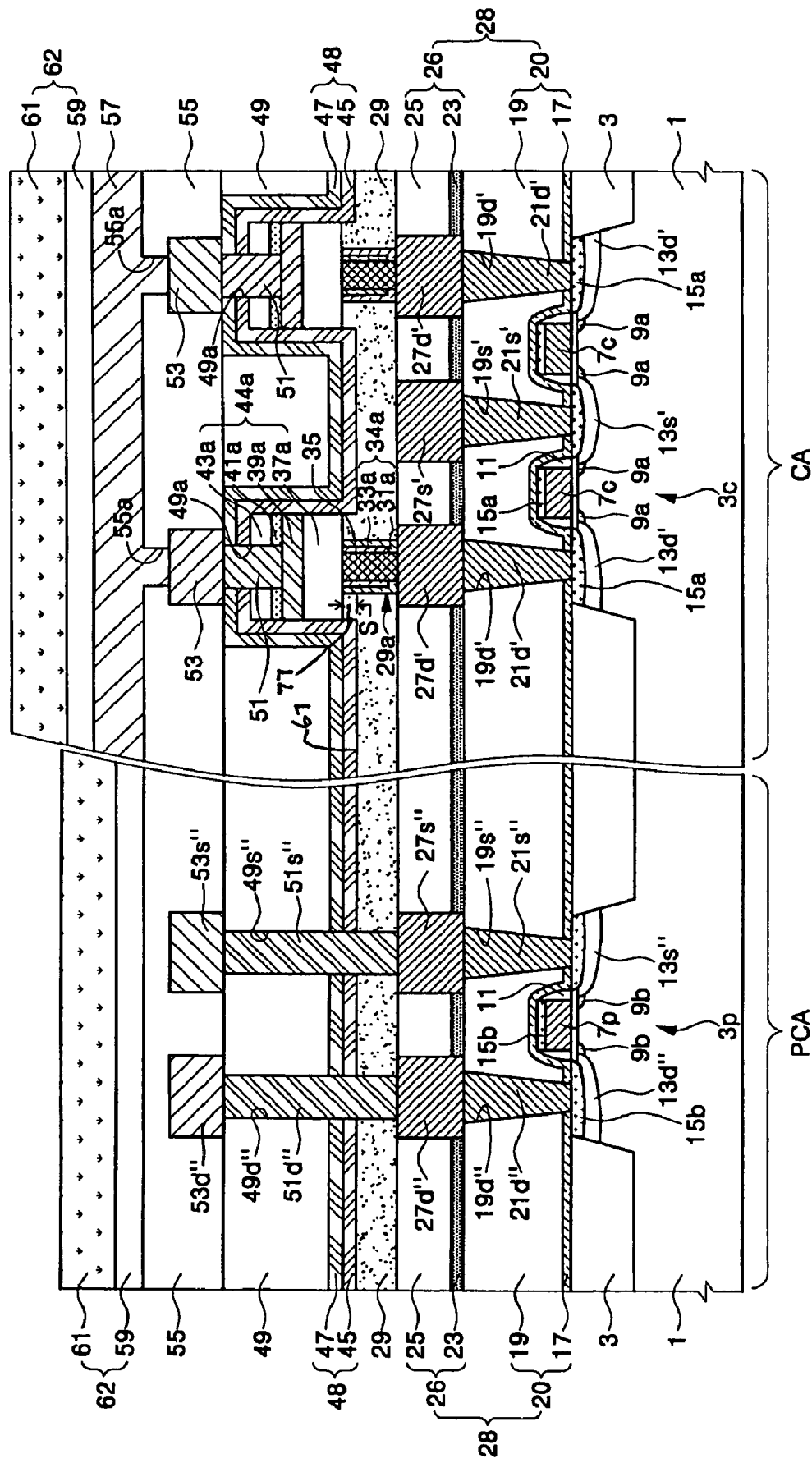

FIG. 9 shows the structure of FIG. 8 with the addition of a lower inter-metal dielectric (IMD) 49, an upper electrode contact hole 49a, an upper peripheral source pad contact hole 49s''', an upper peripheral drain pad contact hole 49d''', an upper electrode contact plug 51, a peripheral upper source plug 51s''', a peripheral upper drain plug 51d''', a bit line pad 53, a source metal line 53s''', a drain metal line 53d''', an upper IMD 55, a bit line contact hole 55a, and a bit line 57. These additional elements are added according to processes known to those familiar in the art.

Next, a passivation layer 62 including a silicon oxide layer 59 and a silicon nitride layer 61 is formed on the resulting structure to complete a phase-change memory device having the oxidation barrier layer 48.

Consequently, the resulting memory device includes a molding layer 29 overlying a semiconductor substrate 1. The molding layer 29 has a protrusion portion 77 vertically extending from a top surface 67 of the molding layer 29. The protrusion portion 77 may have a thickness of at least 100 angstroms, preferably, in a range of about 300 to about 600 angstroms.

The memory device further includes a phase-changeable material pattern 37a adjacent to the protrusion portion 77 and a lower electrode 35 electrically connected to the phase-changeable material pattern 37a. The lower electrode 35 may extend through the protrusion portion 77, preferably along a center portion thereof. The protrusion portion 77 may be located above the first drain pad, i.e., conductive pad 27d'. Further, the phase-changeable material pattern 37a may overlie the protrusion portion 77, although other configurations are also possible as long as the phase-changeable material pattern 37a is adjacent the protrusion portion 77 within the spirit and scope of the present invention. Also, a sidewall of the phase-changeable material pattern 37a may be self-aligned with a sidewall of the protrusion portion 77. The phase-changeable material pattern 37a preferably comprises a chalcogenide material such as a GST (GeSbTe) alloy. According to an aspect of the present invention, the GST alloy may be doped by at least one of silicon and nitrogen.

The device may further include an upper electrode 39a electrically connected to the phase-changeable material pattern 37a.

Also, the device may include an oxidation barrier layer 48 covering at least a portion of a sidewall of the phase-changeable material pattern 37a and at least a portion of a sidewall of the protrusion portion 77. In one aspect, the oxidation barrier layer 48 may cover the phase-changeable material pattern 37a and the upper electrode 39a. More particularly, the oxidation barrier layer 48 preferably covers an area where a sidewall of the phase-changeable material pattern 37a and a sidewall of the protrusion portion 77 adjoin such that penetration of oxygen into the phase-change resistor 44a can be efficiently blocked. Consequently, with the embodiments of the present invention, a more reliable phase-change memory device can be formed in the present invention.

In another aspect of the present invention, the oxidation barrier layer 48 may comprise a first portion overlying a top of the upper electrode 39a and a second portion covering a sidewall of the phase-change layer pattern 37a. Although not illustrated in the drawing, the first portion has a thickness greater than the thickness of the second portion. Preferably, the thickness of the second portion is greater than or equal to about 300 angstroms.

Figure 10:
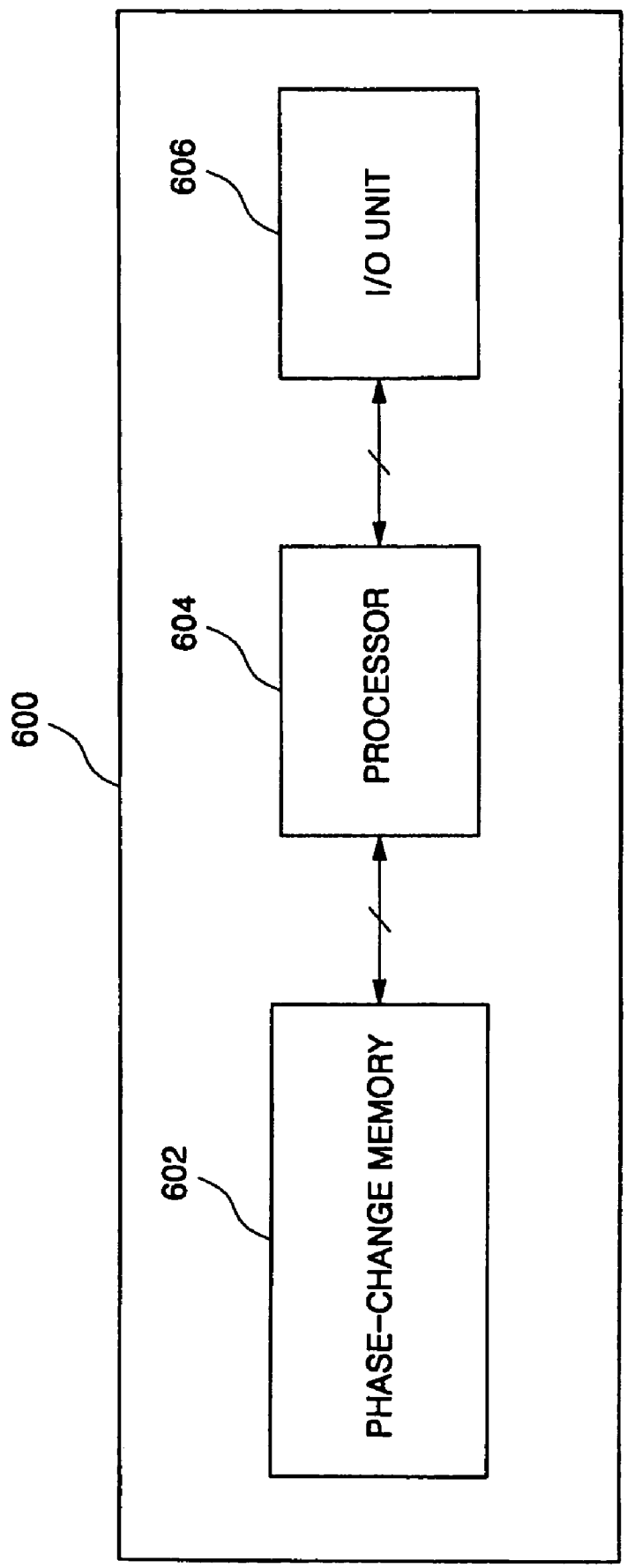
FIG. 10 is a schematic block diagram of a portable electronic apparatus adopting an embodiment of a phase-change memory device of the invention.

FIG. 10 shows a typical application of an embodiment of the invention. A portable electronic apparatus 600, such as a cell phone, utilizes a phase-change memory device 602 in conjunction with a processor 604 and an input/output device 606.

Figure 11:
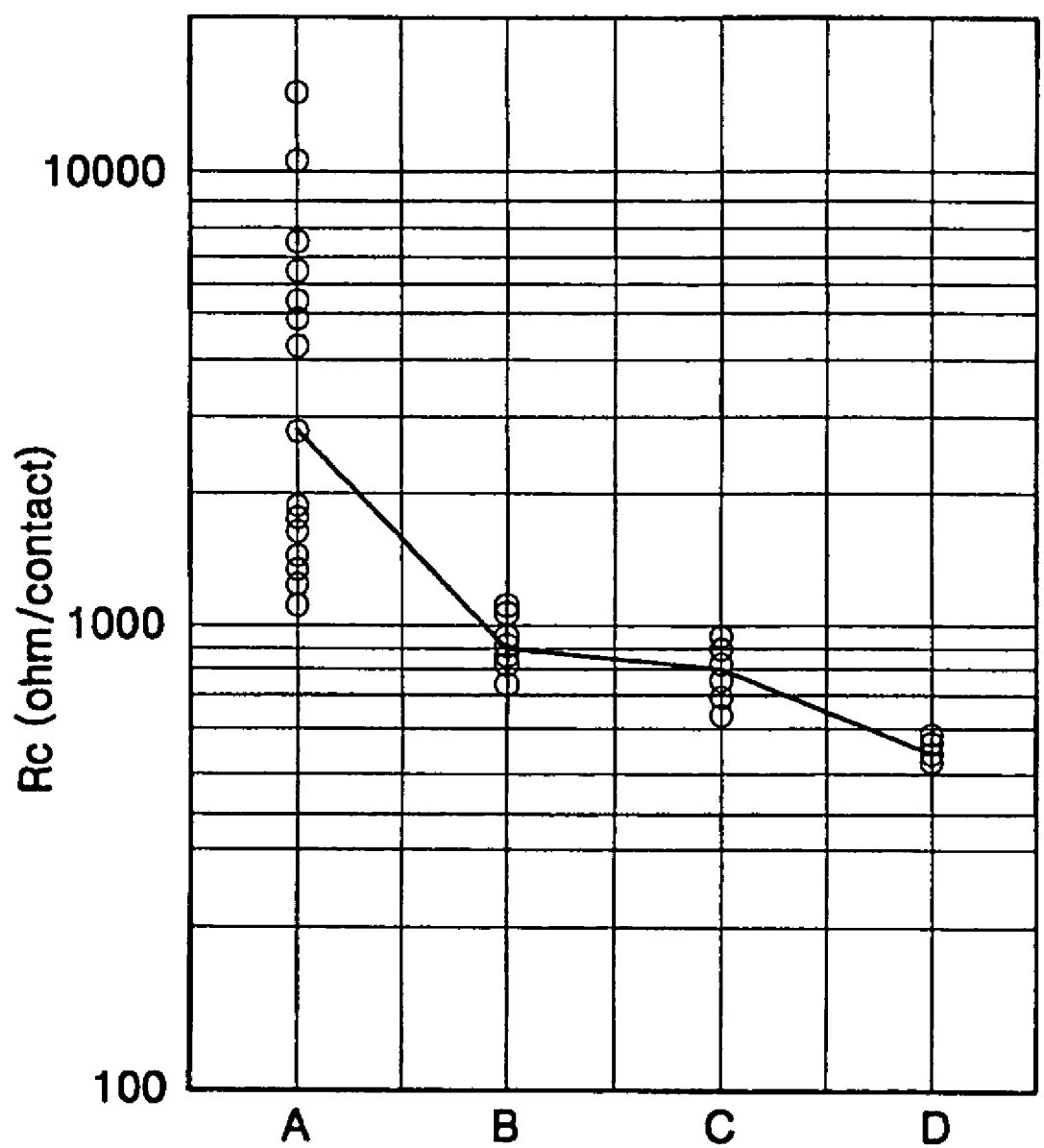
FIG. 11 is a graph showing the lower electrode contact resistance characteristic between a phase-changeable material and a lower electrode of the phase-change resistors manufactured according to embodiments of the present invention.

FIG. 11 is a plot showing a distribution of contact resistances for four samples, A, B, C, and D shown in Table 1 below.

| process parameter | Prior art sample A | Some of the examples of the present invention | | |
|---|---|---|---|---|
| | | sample B | sample C | sample D |
| molding layer | | silicon oxynitride (SiON) | | |
| outer contact spacer | | silicon oxynitride (SiON; plasma CVD) | | |
| Inner contact spacer | | silicon nitride (SiN; LP CVD) | | |
| lower electrode | | titanium nitride (TiN), diammeter: 50 nm) | | |
| phase-change material | | GeSbTe alloy | | |
| upper electrode | | titanium (TiN) | | |

-continued

| | Prior art | Some of the examples of the present invention | | |
|---|---|---|---|---|
| process parameter | sample A | sample B | sample C | sample D |
| oxygen barrier | None | SiON layer (200° C., PECVD, 200 Å) | SiN layer 200° C., PECVD, 200 Å) | lower SiN layer (200° C., PECVD, 200 Å) upper SiN layer (400° C., PECVD, 200 Å) |

Sample A does not include an oxidation barrier layer, in contrast with the embodiments of the present invention. In FIG. 11 it is easy to see that the contact resistance for sample A has a much greater distribution than those of samples B, C, and D, each of which includes an oxygen barrier of various embodiments of the present invention.

Specifically, sample B comprises a SiON layer, sample C comprises an SiN layer, and sample D comprises a lower and an upper oxidation barrier layer, each of SiN. For sample B, the SiON layer is formed using a PECVD process at 200° C., to a thickness of 200 Å. For sample C, the SiN layer is formed the same way as for sample B. For sample D, both SiN layers are formed as for samples B and C, except the upper layer is processed at 400° C.

FIG. 11 demonstrates the improvement over the conventional art, e.g., sample A, with the lower electrode contact resistances of phase-change resistors of samples B, C, and D showing very uniform distribution characteristics. The sample D among the samples manufactured by the invention has the most stable distribution characteristic.

Figure 12:
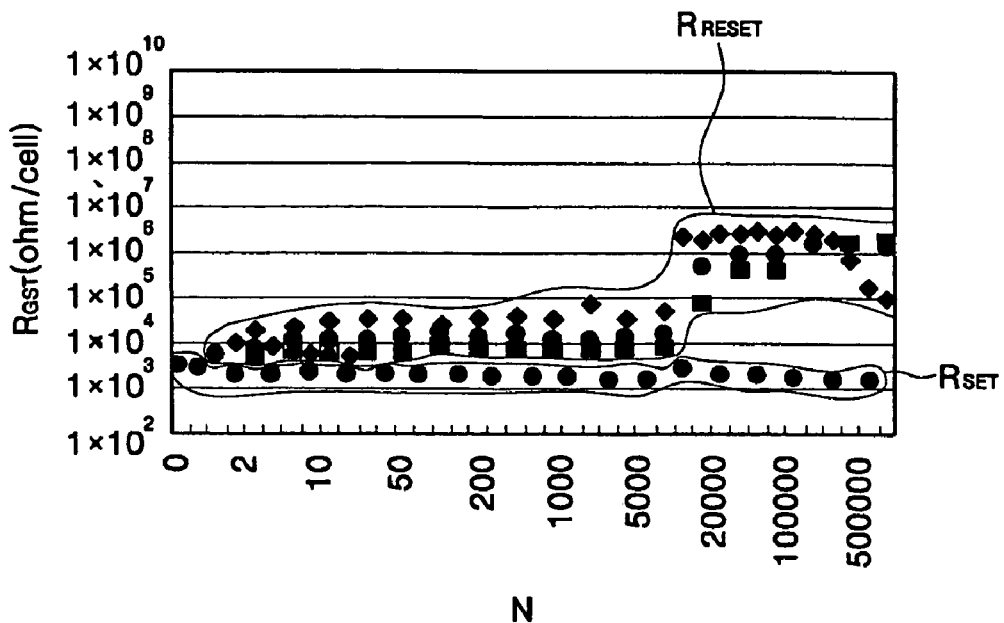
FIG. 12 is a graph showing programming characteristic of a conventional phase-change memory device without an oxidation barrier layer.

FIG. 12 is a graph showing programming characteristics of a conventional phase-change memory device without an oxidation barrier layer.

Up to about 5,000 programming cycles, a conventional phase-change memory device has a very low reset resistance value of 6,000-100,000 Ω, as compared with a set resistance value. Thus it is difficult to get enough sensing margin to read the memory cell information accurately.

Figure 13:
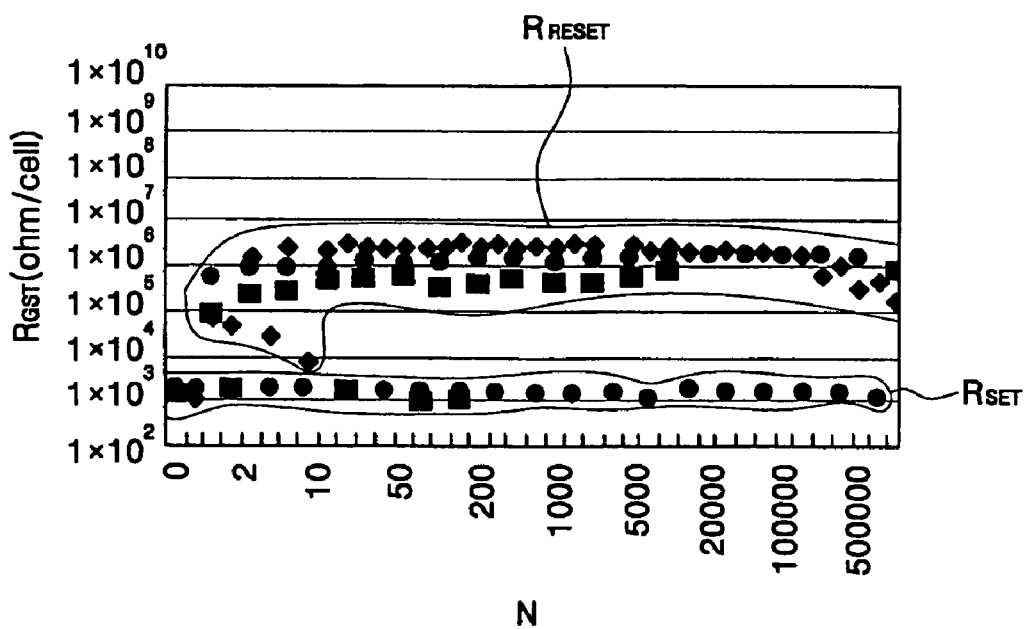
FIG. 13 is a graph showing programming characteristic of a phase-change memory device of an embodiment of the invention with an oxidation barrier layer.

FIG. 13 is a graph showing programming characteristic of a phase-change memory device of an embodiment of the present invention with an oxidation barrier layer. After 10 programming cycles, the phase-change memory device according to an embodiment of the invention has a very high reset resistance value of 30,000-3,000,000 Ω as compared with a set resistance value. Thus it has a very high sensing margin.

Comparing FIGS. 12 and 13, one can see that the interface region acting as a programming region of a phase-changeable material layer pattern of the present invention with an oxidation barrier layer has a better quality than that of a conventional phase-changeable material layer pattern.

Although the invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. A semiconductor memory device comprising:
a molding layer overlying a semiconductor substrate, the molding layer having a protrusion portion extending above a top surface thereof;
a phase-changeable material pattern over the protrusion portion, wherein a sidewall of the phase-changeable material pattern is self-aligned with a sidewall of the protrusion portion; and
a lower electrode electrically connected to the phase-changeable material pattern.

2. The device of claim 1, further comprising an oxidation barrier layer covering at least a portion of a sidewall of the phase-changeable material pattern and at least a portion of a sidewall of the protrusion portion.

3. The device of claim 1, further comprising an upper electrode electrically connected to the phase-changeable material pattern.

4. The device of claim 3, further comprising an oxidation barrier layer covering the phase-changeable material pattern and the upper electrode.

5. The device of claim 1, wherein the phase-changeable material pattern comprises a chalcogenide material.

6. The device of claim 5, wherein the chalcogenide material comprises a GST (GeSbTe) alloy.

7. The device of claim 6, wherein the GST alloy is doped by at least one of silicon and nitrogen.

8. The device of claim 1, wherein the protrusion portion has a thickness of at least 100 angstroms.

9. The device of claim 8, wherein the thickness is in a range of about 300 to about 600 angstroms.

10. A semiconductor memory device comprising:
a molding layer disposed over a semiconductor substrate, the molding layer having a protrusion portion extending above a top surface of the molding layer;
a phase-changeable material pattern overlying the protrusion portion;
an oxidation barrier layer covering an area where a sidewall of the phase-changeable material pattern and a sidewall of the protrusion portion adjoin; and
a lower electrode electrically connected to the phase-changeable material pattern, the lower electrode extending through the protrusion portion.

11. The device of claim 10, further comprising an upper electrode overlying the phase-changeable material pattern.

12. The device of claim 11, further comprising a hard mask on the upper electrode.

13. The device of claim 12, wherein the oxidation barrier layer covers the upper electrode and the phase-changeable material pattern.

14. The device of claim 13, wherein the oxidation barrier layer comprises a first portion overlying a top of the upper electrode and a second portion covering a sidewall of the phase-change layer pattern, wherein the first portion has a thickness greater than the thickness of the second portion.

15. The device of claim 14, wherein the thickness of the second portion is greater than or equal to about 300 angstroms.

16. The device of claim 10, wherein the oxidation barrier layer comprises a lower layer and an upper layer.

17. The device of claim 16, wherein the lower layer is formed by a PE-CVD or ALD at less than or equal to about 350° C. and the upper layer is formed by a PE-CVD or LP CVD at greater than or equal to about 350° C.

18. The device of claim 10, wherein the oxidation barrier layer comprises a single layer of nitride.

19. The device of claim 18, wherein the oxidation barrier layer comprises silicon nitride or silicon oxynitride, deposited using a PE-CVD process, or an atomic layer deposition (ALD) process at less than or equal to about 350° C.

20. The device of claim 10, wherein a sidewall of the phase-changeable material pattern is self-aligned with a sidewall of the protrusion portion.

21. The device of claim 10, wherein the phase-changeable material pattern comprises a chalcogenide material.

22. The device of claim 10, further comprising:
a switching transistor formed on the semiconductor substrate;
an interlayer insulating layer overlying the switching transistor, the interlayer insulating layer having a conductive pad electrically connected to the switching transistor and the lower electrode,
wherein the molding layer protrusion portion is located above the conductive pad.

23. The device of claim 22, wherein the switching transistor comprises a gate electrode, a source region and a drain region, and wherein the conductive pad is electrically coupled to the drain region.

24. The device of claim 23, further comprising a common source line disposed within the interlayer insulating layer, the common source line being electrically connected to the source region.

25. The device of claim 23, further comprising a silicide layer located on at least one of the source/drain region and the gate electrode.

26. The device of claim 22, wherein the molding layer has a thermal conductivity higher than that of silicon oxide.

27. The device of claim 26, wherein the molding layer comprises silicon oxynitride or silicon nitride.

28. The device of claim 22, further comprising a contact spacer surrounding the sidewall of the lower electrode.

29. The device of claim 28, wherein the contact spacer comprises an inner contact spacer and an outer contact spacer, the outer contact spacer surrounding an outer wall of the inner contact spacer.

30. A semiconductor memory device comprising:
a memory cell area on a semiconductor substrate, the cell area including:
a first transistor having a first source/drain region, a first gate electrode having a first width, and a first gate dielectric disposed between the first gate electrode and the substrate; and
a phase-change resistor including:
a molding layer overlying the semiconductor substrate, the molding layer having a protrusion portion extending above a top surface thereof;
a phase-changeable material pattern adjacent the protrusion portion;
a lower electrode electrically connected to the phase-changeable material pattern;
an upper electrode electrically connected to the phase-changeable material pattern; and
an oxidation barrier layer covering the sidewall of the phase-changeable material pattern and the sidewall of the protrusion portion; and
a peripheral circuit area on the semiconductor substrate, the peripheral circuit area having a second transistor including a second gate electrode having a second width, a second source/drain region, and a second gate dielectric disposed between the substrate and the second gate electrode, wherein the first width is different from the second width.

31. The device of claim 30, wherein the second width is at least 1.5 times greater than the first width.

32. The device of claim 30, wherein a sidewall of the protrusion portion is self-aligned with a sidewall of the phase-changeable material pattern.

33. The device of claim 30, wherein the second gate dielectric is thicker than the first gate dielectric.

34. The device of claim 30, wherein the phase-changeable material pattern comprises a chalcogenide material.

35. The device of claim 30, wherein a sidewall of the phase-changeable material pattern is self-aligned with a sidewall of the protrusion portion.

36. The device of claim 30, wherein the oxidation barrier layer comprises a lower layer and an upper layer.

37. The device of claim 30, wherein the oxidation barrier layer comprises a first portion overlying a top of the upper electrode and a second portion covering a sidewall of the phase-change layer pattern, wherein the first portion has a thickness greater than the thickness of the second portion.

38. The device of claim 30, further comprising a silicide layer located on at least one of the first and the second source/drain regions and the first and second gate electrodes of the first and second transistors, respectively.

39. A system comprising:
a processor;
input and output in communication with the processor; and
a phase-change memory device in communication with the processor, the device including:
a molding layer overlying a semiconductor substrate, the molding layer having a protrusion portion extending above a top surface thereof;
a phase-changeable material pattern adjacent the protrusion portion;
a lower electrode electrically connected to the phase-changeable material pattern; and
an oxidation barrier layer on the phase-changeable material pattern and the molding layer, wherein a portion of the oxidation barrier layer extends between the top surface of the molding layer and a top surface of the protrusion portion.

40. The system of claim 39, wherein the oxidation barrier layer covers an area where a sidewall of the phase-changeable material pattern and a sidewall of the protrusion portion adjoin.

41. The system of claim 39, wherein the phase-changeable material comprises a chalcogenide material.

42. The system of claim 39, wherein the chalcogenide material comprises a GST (GeSbTe) alloy.

43. A semiconductor memory device comprising:
a molding layer overlying a semiconductor substrate, the molding layer having a protrusion portion extending above a top surface thereof;
a phase-changeable material pattern adjacent to the protrusion portion;
a lower electrode electrically connected to the phase-changeable material pattern; and
an oxidation barrier layer on the phase-changeable material pattern and the molding layer, wherein a portion of the oxidation barrier layer extends between the top surface of the molding layer and a top surface of the protrusion portion and wherein the oxidation barrier layer comprises a nitride.

44. The device of claim 43, wherein the oxidation barrier layer contacts the top surface of the molding layer.

* * * * *